(12) United States Patent  
Wang et al.

(10) Patent No.: US 12,112,956 B2  
(45) Date of Patent: Oct. 8, 2024

(54) CHIP INTERCONNECTION PACKAGE STRUCTURE AND METHOD

(71) Applicant: Institute of Semiconductors, Guangdong Academy of Sciences, Guangzhou (CN)

(72) Inventors: Yao Wang, Guangzhou (CN); Zibai Li, Guangzhou (CN); Yunzhi Ling, Guangzhou (CN); Xun Xiang, Guangzhou (CN); Yinhua Cui, Guangzhou (CN); Chuan Hu, Guangzhou (CN); Zhitao Chen, Guangzhou (CN)

(73) Assignee: Institute of Semiconductors, Guangdong Academy of Sciences, Guangzhou (CN)

( * ) Notice: Subject to any disclaimer, the term of this patent is extended or adjusted under 35 U.S.C. 154(b) by 507 days.

(21) Appl. No.: 17/434,480

(22) PCT Filed: Feb. 8, 2021

(86) PCT No.: PCT/CN2021/076104  
§ 371 (c)(1),  
(2) Date: Aug. 27, 2021

(87) PCT Pub. No.: WO2022/165854  
PCT Pub. Date: Aug. 11, 2022

(65) Prior Publication Data  
US 2022/0254651 A1    Aug. 11, 2022

(51) Int. Cl.  
*H01L 21/48* (2006.01)  
*H01L 23/538* (2006.01)  
(Continued)

(52) U.S. Cl.  
CPC ........ *H01L 21/485* (2013.01); *H01L 21/4857* (2013.01); *H01L 21/486* (2013.01);  
(Continued)

(58) Field of Classification Search  
CPC ...... H01L 23/5383; H01L 24/19; H01L 24/20  
See application file for complete search history.

(56) References Cited

U.S. PATENT DOCUMENTS

2014/0299999 A1* 10/2014 Hu .................. H01L 21/561  
257/774  
2015/0255416 A1  9/2015 Kim et al.  
(Continued)

FOREIGN PATENT DOCUMENTS

| CN | 105514071 | 4/2016 |
| CN | 106068558 | 11/2016 |
| CN | 112262460 | 1/2021 |

OTHER PUBLICATIONS

International Search Report and Written Opinion dated Oct. 14, 2021 in PCT/CN2021/076104.

*Primary Examiner* — Jay C Chang  
*Assistant Examiner* — Mikka Liu  
(74) *Attorney, Agent, or Firm* — Dicke, Billig & Czaja, PLLC

(57) ABSTRACT

Provided are a chip interconnection package structure and method, including: forming a sacrificial pattern layer on a support structure; forming an interconnection winding pattern layer on the sacrificial pattern layer, wherein the interconnection winding pattern layer is corresponding to a sacrificial pattern of the sacrificial pattern layer in position; forming a first insulating layer on the interconnection winding pattern layer; forming a plurality of chips arranged at intervals on the first insulating layer, wherein the plurality of chips are respectively corresponding to the interconnection winding pattern of the interconnection winding pattern layer (Continued)

in position; and removing the support structure, and forming, on one side of the sacrificial pattern layer, a first interconnection hole penetrating through the sacrificial pattern, the interconnection winding pattern and the first insulating layer, and making the first interconnection hole aligned and communicated with a first interconnection pin of the chip corresponding in projection position.

20 Claims, 5 Drawing Sheets

(51) Int. Cl.
    *H01L 25/065*     (2023.01)
    *H01L 23/00*     (2006.01)
(52) U.S. Cl.
    CPC ...... *H01L 23/5383* (2013.01); *H01L 25/0655* (2013.01); *H01L 24/19* (2013.01); *H01L 24/20* (2013.01); *H01L 2224/211* (2013.01); *H01L 2924/381* (2013.01)

(56) References Cited

U.S. PATENT DOCUMENTS

| | | |
|---|---|---|
| 2016/0218082 A1 | 7/2016 | Lee et al. |
| 2017/0162556 A1* | 6/2017 | Lin .................. H01L 23/544 |
| 2019/0311989 A1 | 10/2019 | Hadizadeh |

* cited by examiner

CHIP INTERCONNECTION PACKAGE STRUCTURE AND METHOD

CROSS-REFERENCE TO RELATED APPLICATION

This Utility Patent Application claims priority under 35 U.S.C. § 371 to International Application Serial No. PCT/CN2021/076104, filed Feb. 8, 2021, which is incorporated herein by reference in its entirety.

TECHNICAL FIELD

The present application relates to the technical field of semiconductor packaging, and in particular, to a chip interconnection package structure and method.

BACKGROUND ART

In the semiconductor industry, the integration level of various electronic components, such as the transistors, diodes, resistors and capacitors, is continuously improved by the minimum feature size being continuously reduced, which allows more components to be concentrated in a given area, thereby improving the computing power of a chip. However, as the minimum feature size is continuously reduced at the nanometer scale, the physical limit is almost reached. At the same time, technologies, such as artificial intelligence, Internet of Things, 5G, autonomous driving, and high-performance cloud computing, are undergoing rapid development. In this environment, it is necessary to increase the data transmission bandwidth while realizing the interconnection between various chips over a short distance.

As for the existing multi-chip short-distance interconnection solutions, finer interconnection lines cannot be manufactured usually due to manufacturing accuracy problems, which in turn leads to the inability of increasing the data transmission bandwidth.

SUMMARY

The purpose of the present application is to provide, in view of the above-mentioned deficiencies in the prior art, a chip interconnection package structure and method, so as to solve the problem that finer interconnection lines cannot be manufactured due to the manufacturing accuracy problem when the existing multiple chips are interconnected over a short distance.

To achieve the foregoing purpose, the embodiments of the present application adopt the technical solutions as follows.

One aspect of the embodiments of the present application provides a chip interconnection package method, comprising: forming a sacrificial pattern layer on one side surface of a support structure; forming an interconnection winding pattern layer on the sacrificial pattern layer, wherein the interconnection winding pattern layer has a winding pattern which is corresponding to a sacrificial pattern of the sacrificial pattern layer in terms of position; forming a first insulating layer on the interconnection winding pattern layer; forming a plurality of chips arranged at intervals on the first insulating layer, wherein the plurality of chips are respectively corresponding to the interconnection winding pattern of the interconnection winding pattern layer in terms of position; and removing the support structure, and forming, on one side of the sacrificial pattern layer, a first interconnection hole penetrating through the sacrificial pattern, the interconnection winding pattern and the first insulating layer, and making the first interconnection hole aligned and communicated with a first interconnection pin of the chip which is corresponding in projection position.

Optionally, after forming, on one side of the sacrificial pattern layer, a first interconnection hole penetrating through the sacrificial pattern, the interconnection winding pattern and the first insulating layer, and making the first interconnection hole aligned and communicated with a first interconnection pin of the chip which is corresponding in projection position, the method further comprises: forming a conductive material within the first interconnection hole, wherein the conductive material in the first interconnection hole is electrically connected to the interconnection winding pattern and the first interconnection pin of the chip.

Optionally, the interconnection winding pattern has a line width of 0.5 µm to 2 µm, and a line pitch of 0.5 µm to 2 µm.

Optionally, after forming a plurality of chips arranged at intervals on the first insulating layer, the method further comprises: forming a plastic package on the plurality of the chips.

Optionally, after forming, on one side of the sacrificial pattern layer, a first interconnection hole penetrating through the sacrificial pattern, the interconnection winding pattern and the first insulating layer, and making the first interconnection hole aligned and communicated with a first interconnection pin of the chip which is corresponding in projection position, the method further comprises: removing the sacrificial pattern layer, or, removing a metal sacrificial layer when the sacrificial pattern layer comprises an insulating sacrificial layer and the metal sacrificial layer sequentially disposed on the interconnection winding pattern layer.

Optionally, after removing the sacrificial pattern layer, or, removing a metal sacrificial layer when the sacrificial pattern layer comprises an insulating sacrificial layer and the metal sacrificial layer sequentially disposed on the interconnection winding pattern layer, the method further comprises: forming a first package winding layer on one side of the interconnection winding pattern layer away from the chip; and forming, on one side of the first package winding layer, a second interconnection hole penetrating through the first package winding layer, and making the second interconnection hole aligned and communicated with the interconnection winding pattern corresponding in projection position.

Optionally, after forming a first package winding layer on one side of the sacrificial pattern layer away from the chip, the method further comprises: forming, on one side of the first package winding layer, a third interconnection hole penetrating through the first package winding layer, and making the third interconnection hole aligned and communicated with a second interconnection pin of the chip corresponding in projection position.

Optionally, the forming a first package winding layer on one side of the interconnection winding pattern layer away from the chip comprises: forming a second insulating layer on one side of the interconnection winding pattern layer away from the chip; and forming the first package winding pattern layer on one side of the second insulating layer away from the chip, wherein the first package winding pattern of the first package winding pattern layer is corresponding to the interconnection winding pattern in terms of position.

Optionally, after forming on one side of the first package winding layer a second interconnection hole penetrating through the first package winding layer and making the second interconnection hole aligned and communicated with the winding pattern corresponding in projection position, the method further comprises: forming a second package winding layer on one side of the first package winding layer away from the chip; forming, on one side of the second package winding layer, a fourth interconnection hole penetrating through the second package winding layer, and making the fourth interconnection hole aligned and communicated with the first package winding layer corresponding in projection position.

Optionally, the forming a second package winding layer on one side of the first package winding layer away from the chip comprises: forming a third insulating layer on one side of the first package winding layer away from the chip; and forming a second package winding pattern layer on one side of the third insulating layer away from the chip.

Optionally, the line width of the interconnection winding pattern is smaller than a line width of the first package winding pattern of the first package winding pattern layer; and the line pitch of the interconnection winding pattern is smaller than a line pitch of the first package winding pattern of the first package winding pattern layer.

Optionally, the line width of the first package winding pattern of the first package winding pattern layer is 2 µm to 5 µm, and the line pitch of the first package winding pattern of the first package winding pattern layer is 2 µm to 5 µm.

Optionally, the line width of the second package winding pattern of the second package winding pattern layer is greater than 5 µm.

Another aspect of the embodiments of the present application provides a chip interconnection package structure, which is prepared by adopting any one of chip interconnection package methods mentioned above, comprising: sequentially providing an interconnection winding pattern layer and a plurality of chips on the sacrificial pattern layer, wherein the winding pattern of the interconnection winding pattern layer is corresponding to the sacrificial pattern of the sacrificial pattern layer in terms of position, and the plurality of chips are respectively arranged correspondingly on the interconnection winding pattern of the interconnection winding pattern layer; and forming, on one side of the sacrificial pattern layer, a first interconnection hole penetrating through the sacrificial pattern and the interconnection winding pattern, wherein the first interconnection hole is aligned and communicated with the first interconnection pin of the chip corresponding in projection position.

Another aspect of the embodiments of the present application provides a chip interconnection package structure, which is prepared by applying any one of the above-mentioned chip interconnection package structures.

The present application comprise the following beneficial effects.

The present application provides a chip interconnection package method. A sacrificial pattern layer is formed on one side surface of a support structure; an interconnection winding pattern layer is formed on the sacrificial pattern layer, and the winding pattern of the interconnection winding pattern layer and the sacrificial pattern of the sacrificial pattern layer are corresponding to each other in terms of position; a first insulating layer is formed on the interconnection winding pattern layer; a plurality of chips arranged at intervals are formed on the first insulating layer, and the plurality of chips are respectively corresponding to the interconnection winding pattern of the interconnection winding pattern layer in terms of position; the support structure is removed, and a first interconnection hole penetrating through the sacrificial pattern, the interconnection winding pattern and the first insulating layer is formed on one side of the sacrificial pattern layer, and the first interconnection hole is aligned and communicated to the first interconnection pin of the chip which is corresponding in projection position. Through the provision of the sacrificial pattern layer, it is possible to assist in defining the opening positions for interconnections of a plurality of chips, and then after the interconnection winding pattern layer and the chips are sequentially formed, the plurality of chips can be accurately interconnected and communicated with each other according to the opening positions in the sacrificial pattern.

The present application provides a chip interconnection package structure. By providing the sacrificial pattern layer, it is possible to assist in defining the opening positions for interconnections of a plurality of chips, and then after the interconnection winding pattern layer and the chips are sequentially formed, the plurality of chips can be accurately interconnected and communicated with each other according to the opening positions in the sacrificial pattern.

BRIEF DESCRIPTION OF DRAWINGS

In order to explain the technical solutions of the embodiments of the present application more clearly, the drawings needed to be used in the embodiments will be briefly introduced as follows. It should be understood that the following drawings only show certain embodiments of the present application, and therefore they should not be regarded as a limitation on the scope. For those ordinarily skilled in the art, other related drawings can be obtained from these drawings without any inventive work.

Figure 1:
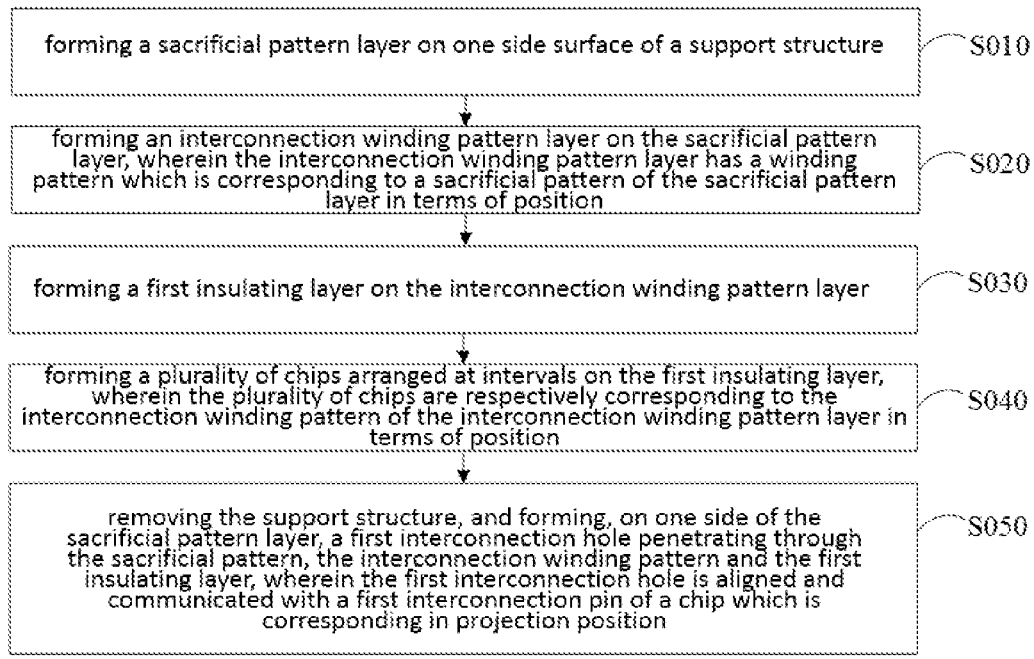
FIG. 1 is a schematic flowchart of a chip interconnection package method provided by embodiments of the present application.

Reference Signs: 010-chip; 020-plastic package; 011-first interconnection pin; 012-second interconnection pin; 101-first insulating layer; 102-first interconnection hole; 103- interconnection winding pattern layer; 104-sacrificial layer; 104a-metal sacrificial layer; 104b-insulating sacrificial layer; 201-second insulating layer; 202-second interconnection hole; 203-first package winding pattern layer; 204-third interconnection hole; 301-third insulating layer; 302-fourth interconnection hole; 303-second package winding pattern layer; 401-solder mask layer; 402-solder ball; 001-temporary support layer; 002-releasable layer; 003-support structure.

DETAILED DESCRIPTION OF EMBODIMENTS

In order to make the purposes, technical solutions and advantages of the embodiments of the present application clearer, the technical solutions in the embodiments of the present application will be described clearly and completely in conjunction with the drawings in the embodiments of the present application below. Obviously, the described embodiments constitute a part of the embodiments of the present application, but do not include all of the embodiments. Generally, the components of the embodiments of the present application described and shown in the drawings herein may be arranged and designed in various different configurations.

Therefore, the following detailed description for the embodiments of the present application provided in the drawings is not intended to limit the scope claimed in the present application, but merely represents selected embodiments of the present application. It should be noted that, if no conflict, the various features in the embodiments of the present application can be combined with each other, and the combined embodiments are still within the protection scope of the present application.

In the description of the present application, it should be noted that the directional or positional relationships indicated by the terms "middle", "upper", "lower", "left", "right", and the like are based on the directional or positional relationships shown in the drawings, or the directional or positional relationships that the product of the present application is usually placed in use, so it cannot be construed as a restriction on the present application. In addition, the terms "first", "second", "third", and the like are only used for distinguishing describing, and cannot be understood as indicating or implying the importance of relativity.

In the description of the present application, it should also be noted that, unless otherwise specified and limited clearly, the terms "provide" and "connect" should be understood in a broad sense. For example, they may be directly connected or indirectly connected through an intermediate medium, and two components can be connected internally. For those ordinarily skilled in the art, the specific meaning of the above-mentioned terms in the present application can be understood under specific circumstances.

In one aspect of the embodiments of the present application, a chip interconnection package method is provided. A patterned sacrificial pattern layer is provided to assist in positioning for the fine interconnection among a plurality of chips 010, so that the short-distance fine interconnection among the plurality of chips 010 can be realized. As shown in FIG. 1, the method may schematically comprises:

S010: forming a sacrificial pattern layer on one side surface of the support structure.

Figure 2:
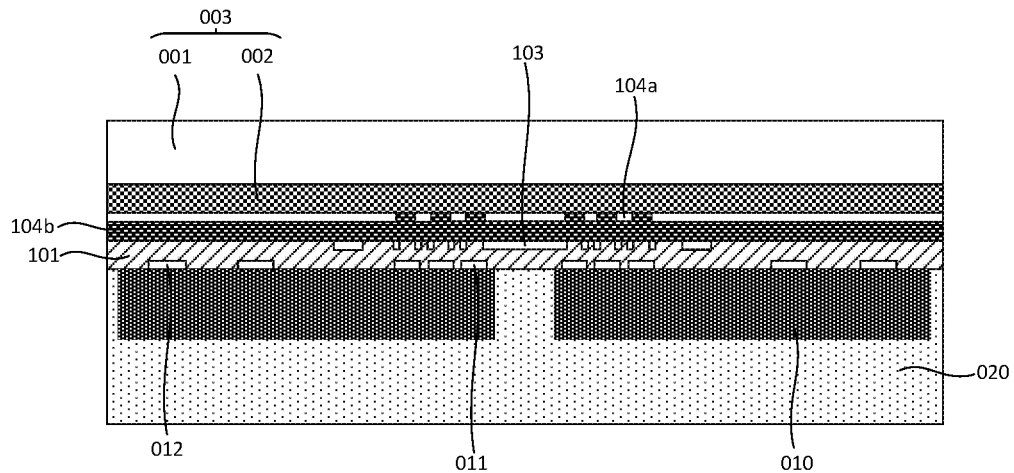
FIG. 2 is the first one of the schematic structural diagrams of a chip interconnection package structure provided by embodiments of the present application.

As shown in FIG. 2, a support structure 003 is provided, and a sacrificial pattern layer is formed on one side surface of the support structure 003, that is, the sacrificial pattern layer is formed under the support structure 003 in FIG. 2. The sacrificial pattern layer may be a hierarchical structure, which is formed by firstly forming an entire sacrificial layer 104 on the surface of the support structure 003, and then performing a patterning process on the entire sacrificial layer 104. The patterning of the sacrificial layer 104 can be set according to the position (hereinafter referred to as the opening position) of the first interconnection hole 102 to be formed later, that is, the sacrificial pattern in the sacrificial pattern layer comprises at least one position where the first interconnection hole 102 is formed, such as two or more opening positions.

S020: forming an interconnection winding pattern layer on the sacrificial pattern layer, with the winding pattern of the interconnection winding pattern layer corresponding to the sacrificial pattern of the sacrificial pattern layer in terms of position.

As shown in FIG. 2, after the sacrificial pattern layer is formed, the interconnection winding pattern layer 103 is continuously formed on the sacrificial pattern layer. The interconnection winding pattern layer 103 may be a hierarchical structure, which is formed by firstly forming an entire layer of the interconnection winding layer on the surface of the support structure 003, and then performing the patterning process on the entire layer of interconnecting winding layer.

The interconnection winding pattern layer 103 can be formed in a manner that it is corresponding to the sacrificial pattern layer in terms of position, that is, after the interconnection winding layer is subjected to the patterning process, the interconnection winding pattern of the interconnection winding pattern layer 103 and the sacrificial pattern of the sacrifice pattern layer are corresponding to each other in terms of position, and for example, the pins in the interconnection winding pattern and the opening positions in the sacrificial pattern are in one-to-one correspondence.

S030: forming a first insulating layer on the interconnection winding pattern layer.

As shown in FIG. 2, a first insulating layer 101 is formed on the interconnection winding pattern layer 103 firstly; then a plurality of chips 010 are formed on the first insulating layer 101, wherein the plurality of chips 010 are arranged in a manner of being mutually spaced, so as to effectively avoid the mutual interference between the plurality of chips 010. At the same time, the first insulating layer 101 should be located between the interconnection winding pattern layer 103 and the layer of the chips 010.

The first insulating layer 101 can be an adhesive layer with adhesion function, which is formed of insulating material or anisotropic conductive material. At this time, when the plurality of chips 010 are formed on the first insulating layer 101, the plurality of chips 010 can be adhesively disposed on the first insulating layer 101 in the manner of being precisely aligned to the interconnection winding pattern layer 103. In order to further improve the stability of the adhesion, the structure obtained after the adhesion can be cured.

S040: forming a plurality of chips arranged at intervals on the first insulating layer, wherein the plurality of chips are respectively corresponding to the interconnection winding pattern of the interconnection winding pattern layer in terms of position.

Figure 3:
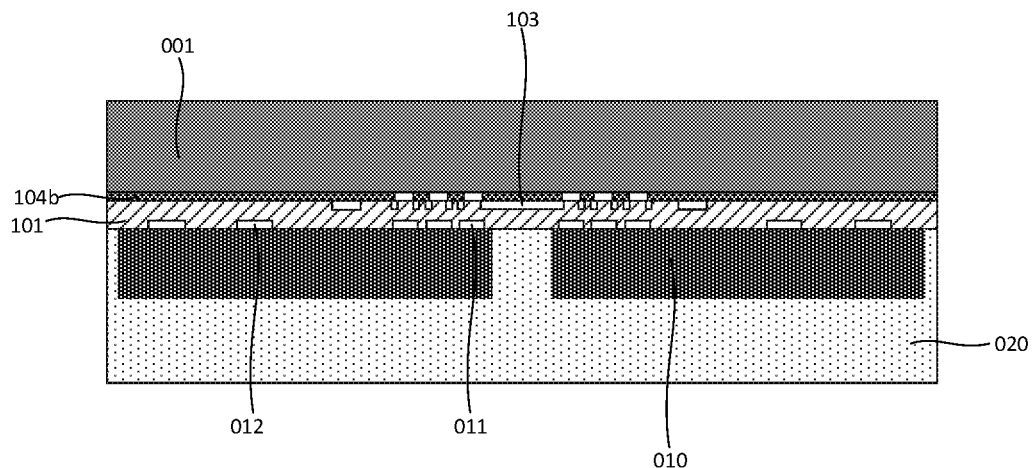
FIG. 3 is the second one of the schematic structural diagrams of a chip interconnection package structure provided by embodiments of the present application.
Figure 4:
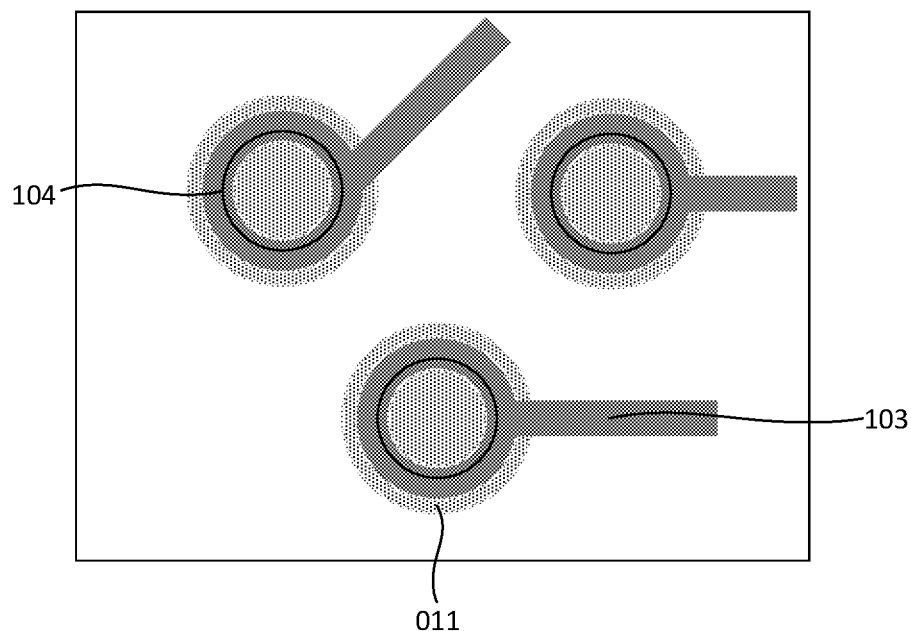
FIG. 4 is a top view of a chip interconnection package structure provided by the embodiments of the present application.
Figure 9:
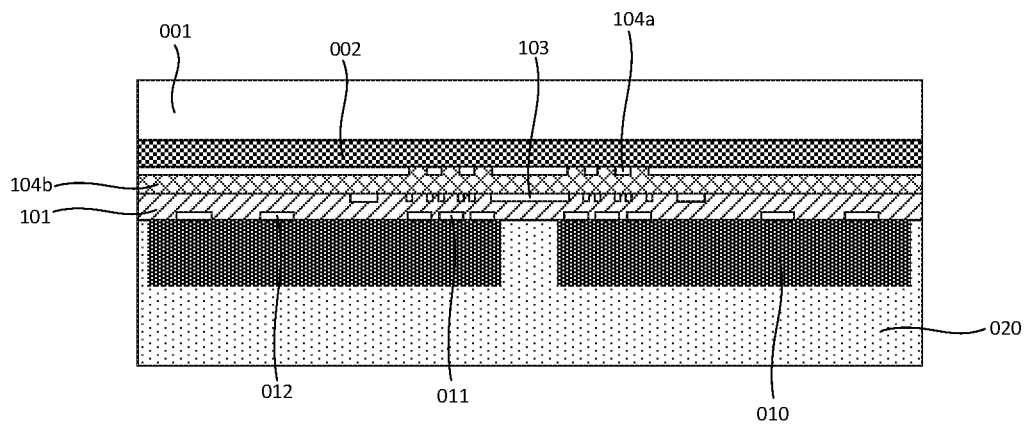
FIG. 9 is the sixth one of the schematic structural diagrams of a chip interconnection package structure provided by embodiments of the present application.

As shown in FIG. 2, FIG. 3, and FIG. 9, a plurality of chips 010 are continuously formed on the first insulating layer 101, and the plurality of chips 010 may be arranged at a certain interval in the same layer. The plurality of chips 010 are respectively corresponding to the interconnection winding pattern, so that the first interconnection pins 011 in the plurality of chips 010 are corresponding to the pins in the interconnection winding pattern. The above-mentioned correspondence may be a correspondence along the direction perpendicular to the support structure 003, that is, the two corresponding to each other are aligned with each other, in terms of orthographic projection position, in the same plane parallel to the plane of the support structure 003. Finally, as shown in FIG. 4, the first interconnection pins 011 on the surfaces of the chips 010, the pin pattern of the interconnection winding pattern layer 103, and opening positions of the surface pattern of the sacrificial layer 104 are in one-to-one correspondence, that is, the above three structures are corresponding along a direction perpendicular to the temporary support layer 001, that is, the two corresponding to each other are partially or completely overlapped, in terms of orthographic projection, in the same plane parallel to the plane of the temporary support layer 001.

S050: removing the support structure, and forming, on one side of the sacrificial pattern layer, a first interconnection hole penetrating through the sacrificial pattern, the interconnection winding pattern and the first insulating layer, and making the first interconnection hole aligned and communicated with a first interconnection pin of the chip which is corresponding in projection position.

Figure 5:
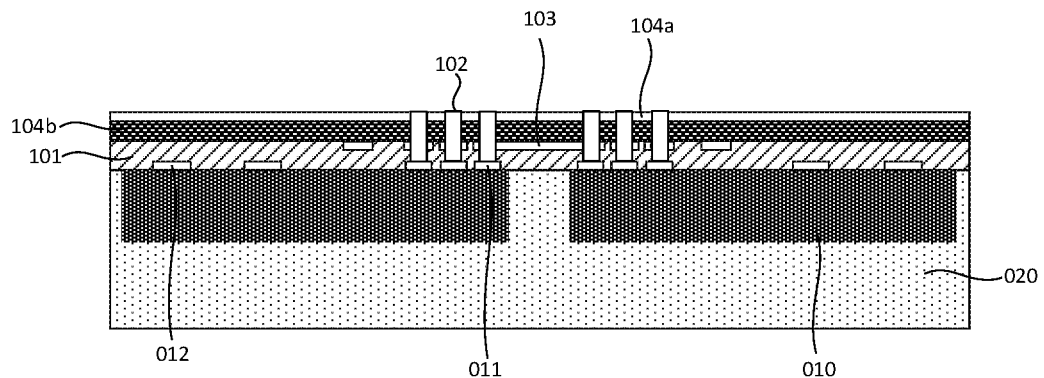
FIG. 5 is the first one of the schematic structural diagrams of a chip interconnection package structure provided by embodiments of the present application.

After S040 is completed, as shown in FIG. 5, the support structure 003 is removed, and then a first interconnection hole 102 is formed on one side of the sacrificial pattern layer according to the opening position in the sacrificial pattern, and the first interconnection hole 102 penetrates sequentially the sacrificial pattern, the interconnection winding pattern and first insulating layer 101. At the same time, the first interconnection hole 102 also extends to the chip 010. Since the opening position in the sacrificial pattern corresponds to the pin in the interconnection winding pattern, the pin in the interconnection winding pattern is corresponding to the first interconnection pin 011 of the chip 010. Therefore, the first interconnection pin 011 of the chip 010 and the opening position in the sacrifice pattern are at least partially overlapped at the projection position of the chip 010. When the first interconnection hole 102 extends to the chip 010, it can make the pin in the interconnection winding pattern communicated with the first interconnection pin 011 of the chip 010, thereby it is realized that the chip 010 and the interconnection winding pattern layer 103 are accurately communicated, such that after all of the plurality of chips 010 are communicated accurately to the interconnection winding pattern layer 103, the interconnection among the plurality of chips 010 is realized. Through the provision of the sacrificial pattern layer, it is possible to assist in defining the opening positions for the interconnection of plurality of chips 010, and then after the interconnection winding pattern layer 103 and the chips 010 are sequentially formed, it can be realized that the plurality of chips 010 are interconnected and communicated with each other accurately according to the opening positions in the sacrificial pattern. First, the structure design and formation by processing on the sacrificial pattern layer and the interconnection winding pattern layer 103 are carried out, and then the chip 010 and the interconnection winding pattern layer 103 are attached, and then a vertical interconnection structure is formed, and the sacrificial pattern layer is removed. Then the subsequent fan-out package winding layer is constructed. Therefore, the alignment accuracy between layers in the vertical direction can be improved, and it is realized that the plurality of chips 010 are interconnected over the short distance with a high precision. In addition, the sacrificial pattern in the sacrificial pattern layer can be used to not only define the position of the first interconnection hole 102, but also define its aperture size.

The interconnection winding pattern of the interconnection winding pattern layer 103 may comprise a plurality of interconnection lines, and each interconnection line may have two pins. Such two pins are respectively corresponding to two first interconnection pins 011 which are respectively belong to the two interconnected chips 010. And then the two chips 010 is initially communicated by the communication of the first interconnection hole 102. As schematically shown in FIG. 4, a part of the three interconnection lines are illustratively shown on the sacrificial pattern layer, wherein the ends of the three lines and the first interconnection pin 011 of one of the interconnection chips 010 are correspondingly overlapped or partially overlapped in vertical direction, and the communication is realized by the first interconnection hole 102 of the ends. In the same way, as the interconnection line extends to the position directly above another one of the interconnection chips 010, the other ends of the three lines and the first interconnection pin of another one of the interconnection chips 010 are correspondingly overlapped or partially overlapped in vertical direction, and the communication is realized by the first interconnection hole 102 of the other end of the interconnection line.

In the embodiments of the present application, as shown in FIG. 2, the first interconnection pin 011 may be a high-density interconnection pin in the chip 010, and the interconnection winding pattern layer 103 may also be a fine line winding layer correspondingly. By means of the assisting positioning of the sacrificial pattern layer, the precision of the fine interconnection among the plurality of chips 010 can be improved, thereby increasing the bandwidth of data transmission.

The support structure 003 functions as temporary support, and it may be made of material which is one or more of silicon, silicon dioxide, glass, laser release material, heat release material, and the like. For example, in one of the embodiments, as shown in FIG. 2, the support structure 003 comprises a temporary support layer 001 (silicon, silicon dioxide, glass, and the like) and a releasable layer 002 (laser release material, heat release material, and the like). It may be achieved in the manner of removing by releasing when the releasable layer 002 is removed to expose the surface of the sacrificial pattern layer, thereby reducing the impact on the sacrificial pattern layer, and further improving the accuracy of forming the first interconnection hole 102 in the sacrificial pattern layer. In another embodiment, as shown in FIG. 3, the support structure 003 comprises a temporary support layer 001. The support structure 003 can be removed by the manner of wet etching, dry etching, laser release removal, heat release removal, and so on. When selecting the removal method, an adaptive selection can be made according to the material of the support structure 003, which is not limited in the present application.

The sacrificial pattern layer is formed of material which can comprises one or more of metal, polyimide, benzocyclobutene (BCB), parylene, industrialized liquid crystal polymer (LCP), epoxy resin, oxides of silicon, nitrides of silicon, oxides of aluminum, and the like. For example, in one of the embodiments, as shown in FIG. 2, the sacrificial pattern layer comprises a metal sacrificial layer 104a and an insulating sacrificial layer 104b, and the insulating sacrificial layer 104b should be located between the metal sacrificial layer 104a and the interconnection winding pattern layer 103. In another embodiment, as shown in FIG. 3, the sacrificial pattern layer may also be an insulating sacrificial layer 104b.

Optionally, after a first interconnection hole 102 penetrating through the sacrificial pattern, the interconnection winding pattern, and the first insulating layer 101 is formed on one side of the sacrificial pattern layer and the first interconnection hole 102 is made to be aligned and connected to the first interconnection pin 011 of the chip 010 corresponding in projection position, the method further comprises: forming conductive material in the first interconnection hole 102, wherein the conductive material in the first interconnection hole 102 is electrically connected to the interconnection winding pattern and the first interconnection pin 011 the chip 010.

Illustratively, after the first interconnection hole 102 is formed, in order to realize the electrical connectivity between the first interconnection pin 011 and the interconnection line of the interconnection winding pattern layer 103, it is also possible to form conductive material in the first interconnection hole 102. The first interconnection pin 011 and the interconnection line in the interconnection winding pattern layer 103 are connected by the conductive material to form a conductive electrical connection structure, thereby realizing the electrically connection between the chip 010 and the interconnection winding pattern layer 103, so that the interconnected chips 010 can be interconnected through the interconnection winding pattern layer 103 to transmit data and the like.

Optionally, the line width of the interconnection winding pattern is 0.5 μm to 2 μm, and the line pitch of the interconnection winding pattern is 0.5 μm to 2 μm.

Illustratively, the line width of the interconnection winding pattern may be the line width of the interconnection line itself in the interconnection winding pattern, which may be set in the range of 0.5 μm to 2 μm (including 0.5 μm and 2 μm). The line pitch of the interconnection winding pattern can be the distance between two adjacent interconnection lines in the interconnection winding pattern, which may be set in the range of 0.5 μm to 2 μm (including 0.5 μm and 2 μm), so as to increase the bandwidth of the data transmission of the chips 010 while ensuring the interconnection of the plurality of chips 010 to be stable.

Optionally, as shown in FIG. 2, after a plurality of chips 010 arranged at intervals are formed on the first insulating layer 10, a plastic package 020 may be formed on the plurality of chips 010, and the plastic package 020 may be formed of an encapsulating material. The plastic package 020 completely encapsulates the plurality of chips 010, that is, covers all the sidewalls of the chip 010 except the sidewall which is attached to the first insulating layer 101, so as to improve the stability of the chip 010. Before removing the support structure 003 in the foregoing embodiment, the plastic package 020 may be formed on the plurality of chips 010 firstly, and then the support structure 003 is removed, and the subsequent processing steps are performed.

Optionally, after a first interconnection hole 102 penetrating through the sacrificial pattern, the interconnection winding pattern and the first insulating layer 101 is formed on one side of the sacrificial pattern layer and the first interconnection hole 102 is made to be aligned and connected to the first interconnection pin 011 of the chip 010 corresponding in projection position, the method further comprises: removing the sacrificial pattern layer, or, removing a metal sacrificial layer 104a when the sacrificial pattern layer comprises an insulating sacrificial layer 104b and the metal sacrificial layer 104a sequentially disposed on the interconnection winding pattern layer.

In the foregoing embodiment, after the structure of the first interconnection hole 102 is formed and the conductive material is filled in the first interconnection hole 102, the sacrificial pattern layer on the interconnection winding pattern layer 103 can be partially removed or completely removed, which may be illustrated exemplarily by the following two embodiments.

Figure 6:
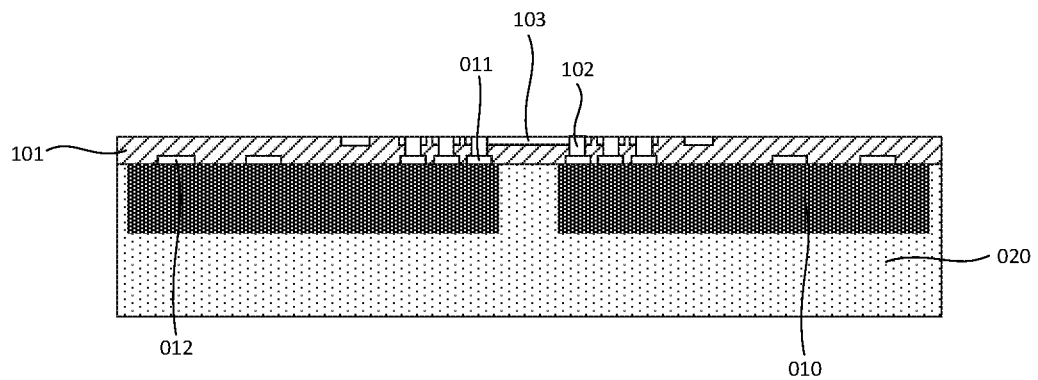
FIG. 6 is the third one of the schematic structural diagrams of a chip interconnection package structure provided by embodiments of the present application.
Figure 7:
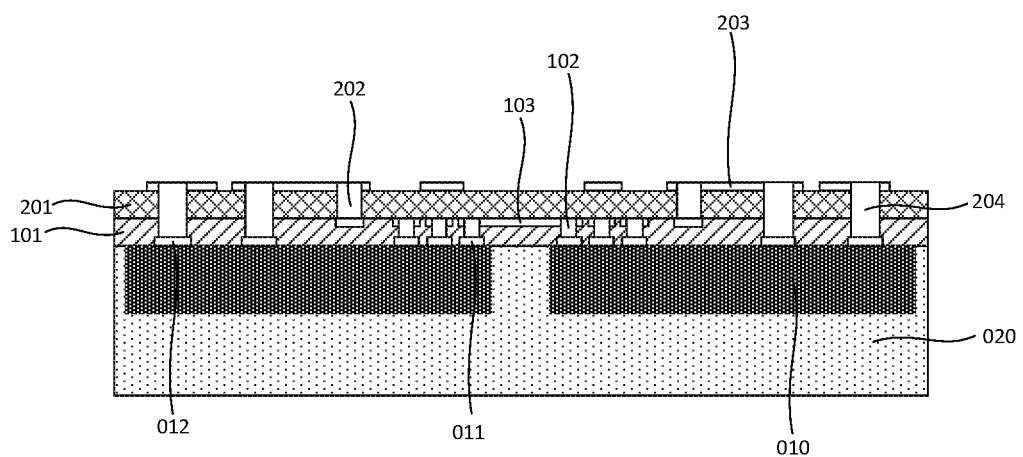
FIG. 7 is the fourth one of the schematic structural diagrams of a chip interconnection package structure provided by embodiments of the present application.

In one of the embodiments, as shown in FIG. 6, the sacrificial pattern layer located on the interconnection winding pattern layer 103 is completely removed, and then the first package winding layer is directly formed on the surface of the interconnection winding pattern layer 103 through subsequent embodiments. The first package winding pattern in the first package winding layer and the interconnection winding pattern are aligned with each other in a vertical direction. In this embodiment, as shown in FIG. 7, the second interconnection hole 202 penetrates the first package winding layer and extends to the surface of the interconnection winding pattern layer 103.

Figure 10:
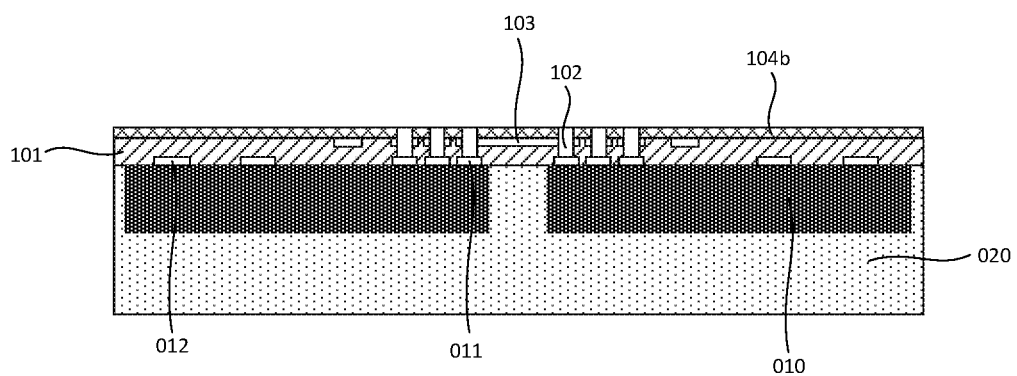
FIG. 10 is the second one of the schematic structural diagrams of a chip interconnection package structure provided by embodiments of the present application.
Figure 11:
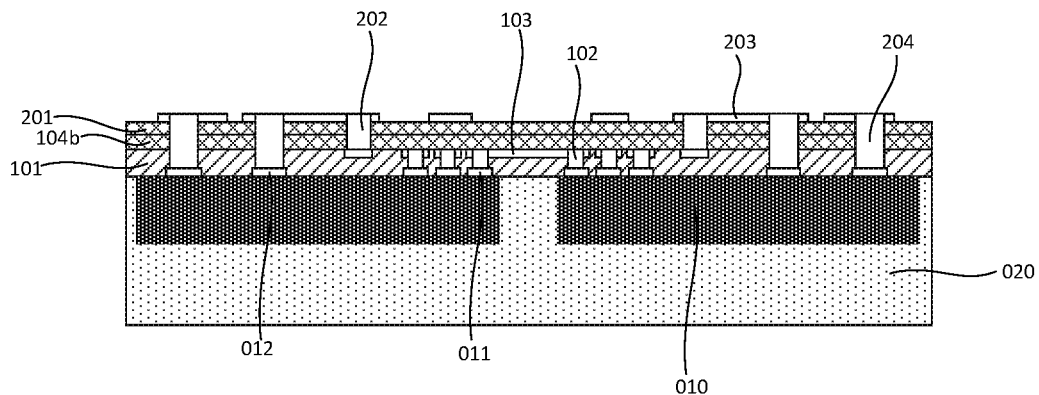
FIG. 11 is the seventh one of the schematic structural diagrams of a chip interconnection package structure provided by embodiments of the present application.

In another embodiment, as shown in FIG. 10, the sacrificial pattern layer located on the interconnection winding pattern layer 103 is partially removed, that is, when the sacrificial pattern layer comprises the insulating sacrificial layer 104b and the metal sacrificial layer 104a located on the interconnection winding pattern layer 103, the metal sacrificial layer 104a can be removed, with the insulating sacrificial layer 104b remaining or part of the insulating sacrificial layer 104b remaining, and then the first package winding layer is formed on the surface of the remaining sacrificial pattern layer through subsequent embodiments, wherein the first package winding pattern in the first package winding layer and the interconnection winding pattern are aligned with each other in a vertical direction. In this embodiment, as shown in FIG. 11, the second interconnection hole 202 sequentially penetrates the first package winding layer and the remaining sacrificial pattern layer (for example, the insulating sacrificial layer 104b in FIG. 11) and extends to the surface of the interconnection winding pattern layer 103.

In the foregoing embodiment, the manner of removing the sacrificial pattern layer may comprise at least one of wet etching, dry etching, mechanical polishing, chemical or mechanical polishing, and the like.

After removing the sacrificial pattern layer, or, removing a metal sacrificial layer when the sacrificial pattern layer comprises an insulating sacrificial layer and the metal sacrificial layer sequentially disposed on the interconnection winding pattern layer, the method further comprises: forming a first package winding layer on one side of the interconnection winding pattern layer 103 away from the chip 010; and forming, on one side of the first package winding layer, a second interconnection hole 202 penetrating through the first package winding layer, and making the second interconnection hole 202 aligned and communicated with the interconnection winding pattern corresponding in projection position.

Illustratively, the first package winding layer may also be further formed on the surface of the interconnection winding pattern layer 103 or the surface of the remaining sacrificial pattern layer, which is formed in the foregoing two embodiments (completely removing the sacrificial pattern layer and partially removing the sacrificial pattern layer), that is, the first package winding layer is formed on the side of the interconnection winding pattern layer 103 away from the chip 010. As shown in FIG. 7 or 9, the first package winding layer is formed above the interconnection winding pattern layer 103. In this embodiment, when the first package winding layer is formed, part of the pins in the first package winding pattern of the first package winding layer (the pins close to the middle part located in the first package winding pattern layer 203, as shown in FIG. 7 or FIG. 11) and the pins in the interconnection winding pattern (pins beside the pins located in the interconnection winding pattern layer 103 and corresponding to the first interconnection pin 011 of the chip 010, as shown in FIG. 7 or FIG. 11) can be aligned. In order to realize the communication between the first package winding layer and the interconnection winding pattern, a second interconnection hole 202 passing therethrough can also be formed on the first package winding layer, so as to make pins in the first package winding pattern on the first package winding layer and the pins in the interconnection winding pattern communicated. In addition, referring to the manner of forming conductive material in the first interconnection hole 102, it is possible to continue forming conductive material in the second interconnection hole 202, so that the pins in the interconnection winding pattern and pins in the first package winding pattern in the first package winding layer can form an electrical connection structure.

Optionally, after forming the first package winding layer on one side of the sacrificial pattern layer away from the chip 010, the method further comprises that: if it is necessary to make the first package winding layer communicated with the chip 010, it is also possible that the pins in the first package winding pattern in the first package winding layer (pins located at the outermost of the pattern layer of the first package winding layer as shown in FIG. 7 or 11) and the second interconnection pins 012 of the chips 010 are aligned with each other in a vertical direction when the first package winding layer is formed. As shown in FIG. 7 or FIG. 11, a third interconnection hole 204 penetrating through the first package winding layer is also formed on one side of the first package winding layer, and the third interconnection hole 204 is aligned and communicated with the second interconnection pin 012 of the chip 010 corresponding in projection position, so as to realize the communication between the first package winding pattern in the first package winding layer and the chip 010.

Figure 8:
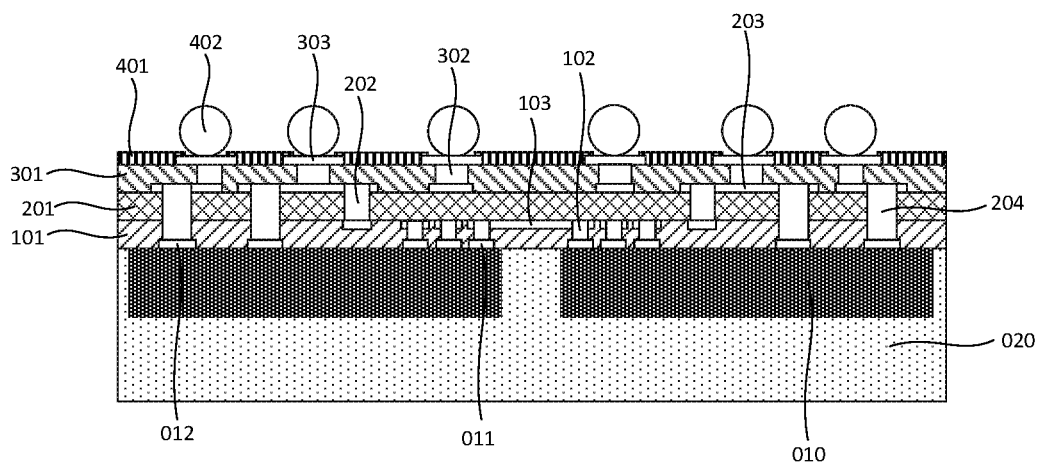
FIG. 8 is the fifth one of the schematic structural diagrams of a chip interconnection package structure provided by embodiments of the present application.
Figure 12:
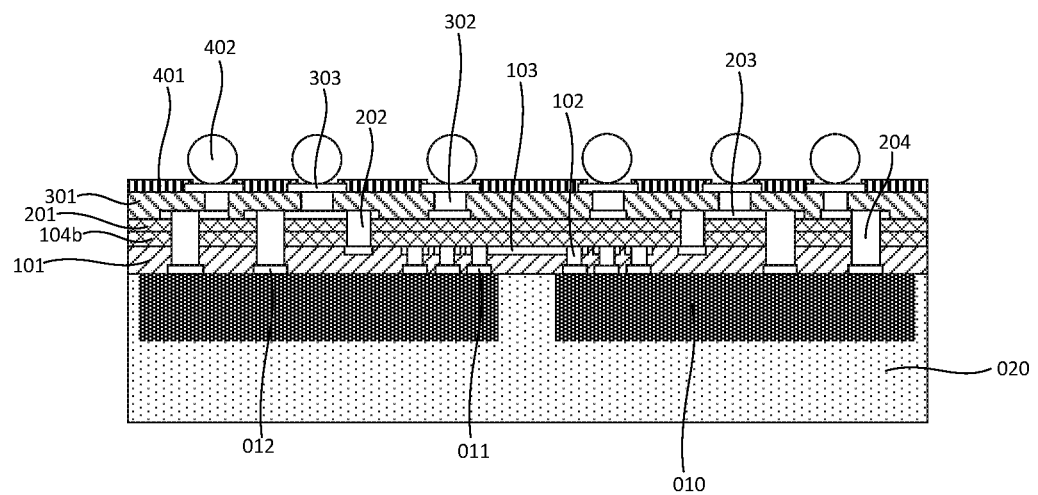
FIG. 12 is the eighth one of the schematic structural diagrams of a chip interconnection package structure provided by embodiments of the present application.

In the embodiment of the present application, as shown in FIG. 8 or FIG. 12, the second interconnection pins 012 may be a low-density interconnection pins in the chip 010.

On the basis of the embodiment of completely removing the sacrificial pattern layer, as shown in FIG. 7, it is also possible to form the third interconnection hole 204 continuously, and the third interconnection hole 204 penetrates the first package winding layer, the interconnection winding pattern layer 103 (no pin at the penetration position of the third interconnection hole 204) and the first insulating layer 101 in sequence, and extends to the surface of the chip 010. When the second interconnection hole 202 and the third interconnection hole 204 are in the same embodiment, they may be formed in the same process, or may be formed one after the other, which is not specifically limited in the present application.

On the basis of the embodiment of partially removing the sacrificial pattern layer, as shown in FIG. 11, it is also possible to form the third interconnection hole 204 continuously, and the third interconnection hole 204 penetrates the first package winding layer, the remaining sacrificial pattern layer (for example, the insulating sacrificial layer 104b in FIG. 11), the interconnection winding pattern layer 103 (no pin at the penetration position of the third interconnection hole 204) and the first insulating layer 101 in sequence, and extends to the surface of the chip 010.

Optionally, the forming the first package winding layer on one side of the interconnection winding pattern layer away from the chip 010 comprises: as shown in FIG. 7 or FIG. 11, forming the second insulating layer 201 on one side of the interconnection winding pattern layer 103 away from the chip 010 and forming the first package winding pattern layer 203 on one side of the second insulating layer 201 away from the chip 010, that is, forming a structure in which the second insulating layer 201 is located between the first package winding pattern layer 203 and the interconnection winding pattern layer 103. The first package winding pattern of the first package winding pattern layer 203 is corresponding, in terms of position, to the interconnection winding pattern (that is, the communicated pins of both are corresponding to each other). In the embodiment which further comprises the third interconnection hole 204, the first package winding pattern of the first package winding pattern layer 203 are also corresponding, in terms of position, to the chip 010 (that is, the communicated pins of both are corresponding to each other), and when penetrating the first package winding layer, the third interconnection hole 204 penetrates the first package winding pattern layer 203 and the second insulating layer 201 sequentially.

Illustratively, in an embodiment, as shown in FIG. 2, FIG. 5, FIG. 6, FIG. 7 and FIG. 8, the support structure 003 may use a glass carrier as the temporary support layer 001, and a laser release material as the releasable layer 002. At the same time, the sacrificial pattern layer can comprises a metal sacrificial layer 104a and an insulating sacrificial layer 104b. The metal sacrificial layer 104a and the insulating sacrificial layer 104b can be completely removed before forming the first package winding layer.

Illustratively, in another embodiment, as shown in FIG. 3, the temporary support layer 001 may only use a silicon wafer as the support structure 003, and at the same time, the sacrificial pattern layer may only use silicon oxide, wherein before forming the first package winding layer, the sacrificial pattern layer of silicon oxide can be completely removed.

Illustratively, in another embodiment, as shown in FIGS. 9, 10, 11, and 12, the support structure 003 may use a wafer as the temporary support layer 001, and a heat release material as the releasable layer 002, and at the same time, the sacrificial pattern layer may comprises a metal sacrificial layer 104a and an insulating sacrificial layer 104b. Before forming the first package winding layer, it is possible to remove only the metal sacrificial layer 104a.

Optionally, after a second interconnection hole 202 penetrating through the first package winding layer is formed on one side of the first package winding layer, and the second interconnection hole 202 is also aligned and communicated with the winding pattern corresponding in projection position, the method further comprises: forming a second package winding layer on one side of the first package winding layer away from the chip 010; and forming a fourth interconnection hole 302 penetrating through the second package winding layer on one side of the second package winding layer. The fourth interconnection hole 302 is also aligned and communicated with the first package winding layer corresponding in projection position.

Illustratively, in the structure in which the second interconnection hole 202 is formed in the foregoing embodiment, a second package winding layer may be further formed on one side of the first package winding layer away from the chip 010, that is, as shown in FIG. 8 or FIG. 12, a second package winding layer is formed above the first package winding layer. In this embodiment, when the second package winding layer is formed, the pins in the second package winding pattern of the second package winding layer and pins in the first package winding pattern of the first package winding layer may be aligned with each other. In order to realize the communication between the second package winding layer and the first package winding layer, it is also possible to form a fourth interconnection hole 302 passing therethrough on the second package winding layer, so as to make pins in the second package winding pattern on the second package winding layer communicated with the pins in the first package winding pattern of the first package winding layer. In addition, it is also possible to continue forming conductive material in the fourth interconnection hole 302 by referring to the manner of forming conductive material in the first interconnection hole 102, so that the pins in the second package winding pattern and pins in the first package winding pattern can form an electrical connection structure.

In the embodiment of the present application, the first interconnection hole 102, the second interconnection hole 202, the third interconnection hole 204, and the fourth interconnection hole 302 may be formed by many processing methods, such as laser printing, photolithography, dry etching and so on. The conductive material may be formed only on the sidewall and bottom of the interconnection hole, or the conductive material may completely fills the interconnection hole. The conductive material can be formed in the interconnection hole by magnetron sputtering or electroless plating of the seed layer metal on the sidewall and bottom of the interconnection hole, or the interconnection hole can be filled with conductive material by using an electroplating process. It is also possible to make the interconnection hole filled with conductive material by using the method of screen/stencil printing of conductive material, which is not limited in the present application. The conductive material in the first interconnection hole 102, the second interconnection hole 202, the third interconnection hole 204, and the fourth interconnection hole 302 may be at least one of copper, aluminum, tungsten, conductive paste, tin-silver alloy, tin-silver-copper alloy, gold-tin alloy, and the like.

When only the sidewall and bottom of the interconnection hole are coated with conductive material, the remaining space inside the interconnection hole can be filled with the material of the next level formed thereon, and for example, the remaining space of the first interconnection hole 102 may be filled with the material of the second insulating layer 201 when the second insulating layer 201 is formed.

Optionally, the forming a second package winding layer on one side of the first package winding layer away from the chip 010 comprises: as shown in FIG. 8 or 12, forming the third insulating layer 301 on one side of the first package winding layer away from the chip 010; and forming the second package winding pattern layer 303 on one side of the third insulating layer 301 away from the chip 010. The second package winding pattern of the second package winding pattern layer 303 is corresponding, in terms of position, to the first package winding pattern (that is, the communicated pins of both are corresponding to each other).

The materials of the first insulating layer 101, the second insulating layer 201, and the third insulating layer 301 in the embodiments of the present application may comprise at least one of polyimide, benzocyclobutene (BCB), parylene, industrialized liquid crystal polymer (LCP), epoxy resin, oxide of silicon, nitride of silicon, ceramic, oxide of aluminum, glass, and the like.

The present application may comprise a plurality of package winding layers. In the above embodiments, one-layer and two-layer embodiments are illustratively given. The package winding layer of multiple-layer, such as three-layer, four-layer, and the like, can be obtained by referring to the embodiment in which the second package winding layer is formed on the first package winding layer, which will not be repeated in the present application. Through this preparation method, the procedure of a multilayer metal line structure can be simplified, and the production cost can be reduced.

After the last layer of package winding layer is formed, the pin pads can be formed thereon, and then the entire layer of solder mask layer 401 is formed. At least part of the solder mask layer 401 covering the pin pads is removed by patterning and solder balls 402 are planted on the pin pads. For example, in FIG. 8 or FIG. 12, pin pads are formed on the second package winding layer, and then the entire layer of solder mask layer 401 is formed. At least part of the solder mask layer 401 covering the pin pads is removed by patterning, and solder balls 402 are planted on the pin pads.

Optionally, the line width of the interconnection winding pattern is smaller than that of the first package winding pattern of the first package winding pattern layer 203; and the line pitch of the interconnection winding pattern is smaller than that of the first package winding pattern of the first package winding pattern layer 203.

Illustratively, the line width of the first package winding pattern of the first package winding pattern layer 203 may be the line width of the package line itself in the first package winding pattern. The line pitch of the first package winding pattern of the first package winding pattern layer 203 may be the distance between two adjacent package lines in the first package winding pattern. The line width of the first package winding pattern may be 2 μm to 5 μm (including 2 μm and 5 μm); and the line pitch of the first package winding pattern may be 2 μm to 5 μm (including 2 μm and 5 μm).

Optionally, the line width of the interconnection winding pattern is smaller than the line width of the second package winding pattern of the second package winding pattern layer 303; and the line pitch of the interconnection winding pattern is smaller than the line pitch of the second package winding pattern of the second package winding pattern layer 303.

Illustratively, the line width of the second package winding pattern of the second package winding pattern layer 303 may be the line width of the package line itself in the second package winding pattern. The line pitch of the second package winding pattern of the second package winding pattern layer 303 may be the distance between two adjacent package lines in the second package winding pattern. The line width of the second package winding pattern may be greater than 5 μm. When a plurality of package winding layers are included, the line width of the package winding pattern of other package winding pattern layers formed on the second package winding layer may be greater than 5 μm.

Optionally, the interconnection pattern winding layer and the package winding layers sequentially formed on one side of the interconnection pattern winding layer away from the chip 010 have the gradually increased line width and line pitch in the direction from the chip 010 to the interconnection pattern winding layer (i.e., in the direction from bottom to top in FIG. 8 or FIG. 12).

Optionally, the line width of the interconnection winding pattern is smaller than the line width of the second package winding pattern of the second package winding pattern layer 303; and the line pitch of the interconnection winding pattern is smaller than the line pitch of the second package winding pattern of the second package winding pattern layer 303.

Illustratively, a sacrificial layer 104 having a pattern is formed on one side surface of the support structure 003. A fine interconnection winding layer is formed on the sacrificial layer 104, and the winding pattern of the fine interconnection winding layer is corresponding, in the position, to the pattern of the sacrificial layer 104. A first insulating layer 101 is formed on the fine interconnection winding layer, and a plurality of chips 010 are attached, with the chips having pins aligned with the pattern of the fine interconnection winding layer. Above structure is packaged using the plastic package 020 from one side of the chip 010. The temporary support layer 001 is removed. The first interconnection hole 102 penetrating through the sacrificial layer 104, the fine interconnection winding layer, and the first insulating layer 101 is formed on one side of the sacrificial layer 104, so that the fine interconnection winding layer is electrically connected with the high-density interconnection pins of the chip. All or part of the sacrificial layer 104 is removed. And then, at least one insulating layer and at least one package winding layer are alternately formed on the first insulating layer 101, and each package winding layer is electrically connected, through the interconnection hole, with the low-density pins of the chip, and/or at least one winding layer prepared in advance.

A sacrificial layer 104 having a pattern is formed on one side surface of the support structure 003; a fine interconnection winding layer is formed on the sacrificial layer 104, and the fine interconnection winding layer is corresponding, in terms of position, to the pattern of the sacrificial layer 104; a first insulating layer 101 is formed on the fine interconnection winding layer; a plurality of chips 010 are attached onto one side of the first insulating layer 101 away from the fine interconnection winding layer, and the plurality of chips 010 are respectively provided correspondingly on the interconnection winding pattern of the fine interconnection winding layer, so as to realize the alignment between high-density inter-chip interconnection pins of the chips 010 and the fine interconnection winding layer; the plurality of chips 010 are plastically packaged using encapsulating material, which covers the first insulating layer 101; the support structure 003 is removed, and the pattern of the sacrificial layer 104 is used to form a first interconnection hole 102 that penetrates through the sacrificial layer 104, the fine interconnection winding layer and the first insulating layer 101 and exposes the high-density interconnection pins of the chip 010; conductive material is formed in the first interconnection hole 102, and the fine interconnection winding layer and the high-density interconnection pins are communicated through the first interconnection hole 102; after all or part of the sacrificial layer 104 is removed, a second insulating layer 201 is formed on the fine interconnection winding layer and the first insulating layer 101 to cover the fine interconnection winding layer and the first interconnection hole 102; a first package winding pattern layer 203 is formed on the second insulating layer 201, and a second interconnection hole 202 and a third interconnection hole 204 are formed on the first package winding pattern layer 203, with the third interconnection hole 202 penetrating through the first package winding pattern layer 203, the second insulating layer 201, the fine interconnection winding layer, and the first insulating layer 101 and exposes the low-density interconnection pins of the chip, and/or the second interconnection hole 202 penetrates through the first package winding pattern layer 203 and the second insulating layer 201 and exposes the fine interconnection winding layer; conductive material is formed in the second interconnection hole 202 to realize the communication between the low-density interconnection pins of the chip and both the fine interconnection winding layer and the first package winding pattern layer; and then at least one insulating layer and at least one package winding pattern layer are alternately formed on one side of the first package winding pattern layer away from the chip, wherein interconnecting holes are formed on each insulating layer, and conductive material is provided in the interconnecting holes, wherein the communication among all the package winding layers is realized through the conductive material in the interconnecting holes; and the package winding layer farthest from the chip is provided with pin pads, and the solder mask layer 401 covers the package winding layer farthest from the chip, and at least part of the solder mask layer 401 covering the pin pads is removed, and solder balls 402 are planted on the pin pads.

In another aspect of the embodiments of the present application, a chip interconnection package structure is provided, which is prepared by using any one of the above-mentioned chip interconnection package method, comprising: as shown in FIG. 2, sequentially providing an interconnection winding pattern layer 103 and a plurality of chips 010 on the sacrificial pattern layer, wherein the winding pattern of the interconnection winding pattern layer 103 is corresponding to the sacrificial pattern of the sacrificial pattern layer in terms of position, and the plurality of chips 010 are respectively arranged correspondingly on the interconnection winding pattern of the interconnection winding pattern layer 103; and forming, on one side of the sacrificial pattern layer, a first interconnection hole 102 penetrating through the sacrificial pattern and the interconnection winding pattern, wherein the first interconnection hole 102 is aligned and communicated with the first interconnection pin 011 of the chip 010 corresponding in projection position. That is, the chip interconnection package structure comprises a plurality of chips 010 and a plurality of winding layers and insulating layers; the chip comprises devices and pins, and the pins comprise high-density interconnection pins and low-density interconnection pins; the plurality of winding layers comprise the interconnection winding pattern layer 103 and the package winding layer (such as the first and second package winding layers), the line width and line pitch of the interconnection winding pattern layer 103 are smaller than the line width and line pitch of the package winding layer; the interconnection winding pattern layer 103 is connected to the chip 010 through the high-density interconnection pins of the chip 010; the first interconnection hole 102 between the interconnection winding pattern layer 103 and the high-density interconnection pins of the chip 010 is formed by using a sacrificial layer structure (sacrificial layer 104) and the pin structure of the interconnection winding pattern layer 103, and the interconnection winding pattern layer 103 and the high-density interconnection pins of the chip 010 are electrically connected by providing conductive material in the first interconnection hole 102; and the pins of the interconnection winding pattern layer 103, the high-density interconnection pins of the chip 010 and the pattern of the sacrificial layer 104 are precisely aligned to each other.

In addition, the chip interconnection package structure can also sequentially form corresponding structures correspondingly to the aforementioned chip interconnection package method.

The foregoing is only description for preferred embodiments of the present application, and not intended to limit the present application. For those skilled in the art, the present application can have various modifications and changes. Any modifications, equivalent replacements, improvements, and etc. made within the spirit and principle of the present application shall be comprised in the protection scope of the present application.

INDUSTRIAL APPLICABILITY

As for the chip interconnection package structure and method of the present application, the structural design and formation by processing on the sacrificial pattern layer and the interconnection winding pattern layer are first performed, and then the chip and the interconnection winding pattern layer are attached, and then the vertical interconnection structure is formed, the sacrificial pattern layer is removed, and then the subsequent fan-out package winding layer is constructed, thereby improving the accuracy of the alignment between layers in a vertical direction, realizing high-precision interconnection among a plurality of chips over short distance, and further increasing the data transmission bandwidth. At the same time, the manufacturing method can also simplify the procedure of the multilayer metal line structure, reduce the production cost, and be applicable to the fields of integrated circuits, optoelectronic devices and the like.

What is claimed is:

1. A chip interconnection package method, wherein the method comprises:
   forming a sacrificial pattern layer on one side surface of a support structure;
   forming an interconnection winding pattern layer on the sacrificial pattern layer, wherein the interconnection winding pattern layer has an interconnection winding pattern which is corresponding to a sacrificial pattern of the sacrificial pattern layer in terms of position;
   forming a first insulating layer on the interconnection winding pattern layer;
   forming a plurality of chips arranged at intervals on the first insulating layer, wherein the plurality of chips are respectively corresponding to the interconnection winding pattern of the interconnection winding pattern layer in terms of position; and
   removing the support structure, and forming, on one side of the sacrificial pattern layer, a first interconnection hole penetrating through the sacrificial pattern, the interconnection winding pattern and the first insulating layer, wherein the first interconnection hole is aligned and communicated with a first interconnection pin of one chip of the plurality of chips which is corresponding in projection position.

2. The chip interconnection package method according to claim 1, wherein after the forming, on one side of the sacrificial pattern layer, a first interconnection hole penetrating through the sacrificial pattern, the interconnection winding pattern and the first insulating layer, wherein the first interconnection hole is aligned and communicated with a first interconnection pin of one chip of the plurality of chips which is corresponding in projection position, the method further comprises:
   forming a conductive material within the first interconnection hole, wherein the conductive material in the first interconnection hole is electrically connected to the interconnection winding pattern and the first interconnection pin of the chip.

3. The chip interconnection package method according to claim 2, wherein the interconnection winding pattern has a line width of 0.5 μm to 2 μm, and a line pitch of 0.5 μm to 2 μm.

4. The chip interconnection package method according to claim 2, wherein after the forming, on one side of the sacrificial pattern layer, a first interconnection hole penetrating through the sacrificial pattern, the interconnection winding pattern and the first insulating layer, wherein the first interconnection hole is aligned and communicated with a first interconnection pin of one chip of the plurality of chips which is corresponding in projection position, the method further comprises:
   removing the sacrificial pattern layer, or, removing a metal sacrificial layer when the sacrificial pattern layer comprises an insulating sacrificial layer and the metal sacrificial layer sequentially disposed on the interconnection winding pattern layer.

5. The chip interconnection package method according to claim 1, wherein the interconnection winding pattern has a line width of 0.5 μm to 2 μm, and a line pitch of 0.5 μm to 2 μm.

6. The chip interconnection package method according to claim 5, wherein after the forming, on one side of the sacrificial pattern layer, a first interconnection hole penetrating through the sacrificial pattern, the interconnection winding pattern and the first insulating layer, wherein the first interconnection hole is aligned and communicated with a first interconnection pin of one chip of the plurality of chips which is corresponding in projection position, the method further comprises:
   removing the sacrificial pattern layer, or, removing a metal sacrificial layer when the sacrificial pattern layer comprises an insulating sacrificial layer and the metal sacrificial layer sequentially disposed on the interconnection winding pattern layer.

7. The chip interconnection package method according to claim 1, wherein after the forming a plurality of chips arranged at intervals on the first insulating layer, the method further comprises:
   forming a plastic package on the plurality of chips.

8. The chip interconnection package method according to claim 7, wherein after the forming, on one side of the sacrificial pattern layer, a first interconnection hole penetrating through the sacrificial pattern, the interconnection winding pattern and the first insulating layer, wherein the first interconnection hole is aligned and communicated with a first interconnection pin of one chip of the plurality of chips which is corresponding in projection position, the method further comprises:
   removing the sacrificial pattern layer, or, removing a metal sacrificial layer when the sacrificial pattern layer comprises an insulating sacrificial layer and the metal sacrificial layer sequentially disposed on the interconnection winding pattern layer.

9. The chip interconnection package method according to claim 1, wherein after the forming, on one side of the sacrificial pattern layer, a first interconnection hole penetrating through the sacrificial pattern, the interconnection winding pattern and the first insulating layer, wherein the first interconnection hole is aligned and communicated with a first interconnection pin of one chip of the plurality of chips which is corresponding in projection position, the method further comprises:
   removing the sacrificial pattern layer, or, removing a metal sacrificial layer when the sacrificial pattern layer comprises an insulating sacrificial layer and the metal sacrificial layer sequentially disposed on the interconnection winding pattern layer.

10. The chip interconnection package method according to claim 9, wherein after the removing the sacrificial pattern layer, or, removing a metal sacrificial layer when the sacrificial pattern layer comprises an insulating sacrificial layer and a metal sacrificial layer sequentially disposed on the interconnection winding pattern layer, the method further comprises:

forming a first package winding layer on one side of the interconnection winding pattern layer away from the chip; and forming, on one side of the first package winding layer, a second interconnection hole penetrating through the first package winding layer, wherein the second interconnection hole is aligned and communicated with the interconnection winding pattern corresponding in projection position.

11. The chip interconnection package method according to claim 10, wherein after forming a first package winding layer on one side of the interconnection winding pattern layer away from the chip, the method further comprises:

forming, on one side of the first package winding layer, a third interconnection hole penetrating through the first package winding layer, wherein the third interconnection hole is aligned and communicated with a second interconnection pin of one chip of the plurality of chips corresponding in projection position.

12. The chip interconnection package method according to claim 11, wherein the forming a first package winding layer on one side of the interconnection winding pattern layer away from the chip comprises:

forming a second insulating layer on one side of the interconnection winding pattern layer away from the chip; and forming a first package winding pattern layer on one side of the second insulating layer away from the chip, wherein a first package winding pattern of the first package winding pattern layer is corresponding to the interconnection winding pattern in terms of position.

13. The chip interconnection package method according to claim 11, wherein after the forming, on one side of the first package winding layer, a second interconnection hole penetrating through the first package winding layer, wherein the second interconnection hole is aligned and communicated with the interconnection winding pattern corresponding in projection position, the method further comprises:

forming a second package winding layer on one side of the first package winding layer away from the chip; and forming, on one side of the second package winding layer, a fourth interconnection hole penetrating through the second package winding layer, wherein the fourth interconnection hole is aligned and communicated with the first package winding layer corresponding in projection position.

14. The chip interconnection package method according to claim 10, wherein the forming a first package winding layer on one side of the interconnection winding pattern layer away from the chip comprises:

forming a second insulating layer on one side of the interconnection winding pattern layer away from the chip; and forming a first package winding pattern layer on one side of the second insulating layer away from the chip, wherein a first package winding pattern of the first package winding pattern layer is corresponding to the interconnection winding pattern in terms of position.

15. The chip interconnection package method according to claim 14, wherein after the forming, on one side of the first package winding layer, a second interconnection hole penetrating through the first package winding layer, wherein the second interconnection hole is aligned and communicated with the interconnection winding pattern corresponding in projection position, the method further comprises:

forming a second package winding layer on one side of the first package winding layer away from the chip; and forming, on one side of the second package winding layer, a fourth interconnection hole penetrating through the second package winding layer, wherein the fourth interconnection hole is aligned and communicated with the first package winding layer corresponding in projection position.

16. The chip interconnection package method according to claim 15, wherein the forming a second package winding layer on one side of the first package winding layer away from the chip comprises:

forming a third insulating layer on one side of the first package winding layer away from the chip; and forming a second package winding pattern layer on one side of the third insulating layer away from the chip.

17. The chip interconnection package method according to claim 16, wherein a line width of a second package winding pattern of the second package winding pattern layer is greater than 5 µm.

18. The chip interconnection package method according to claim 15, wherein a line width of the first package winding pattern of the first package winding pattern layer is 2 µm to 5 µm, and a line pitch of the first package winding pattern of the first package winding pattern layer is 2 µm to 5 µm.

19. The chip interconnection package method according to claim 14, wherein a line width of the interconnection winding pattern is smaller than a line width of the first package winding pattern of the first package winding pattern layer; and a line pitch of the interconnection winding pattern is smaller than a line pitch of the first package winding pattern of the first package winding pattern layer.

20. A chip interconnection package structure, wherein the chip interconnection package structure is prepared by adopting the chip interconnection package method according to claim 1, comprising:

sequentially providing the interconnection winding pattern layer and the plurality of chips on the sacrificial pattern layer, wherein the winding pattern of the interconnection winding pattern layer is corresponding to the sacrificial pattern of the sacrificial pattern layer in terms of position, and the plurality of chips are respectively arranged correspondingly on the interconnection winding pattern of the interconnection winding pattern layer; and forming, on one side of the sacrificial pattern layer, the first interconnection hole penetrating through the sacrificial pattern and the interconnection winding pattern, wherein the first interconnection hole is aligned and communicated with the first interconnection pin of one of the plurality of chips corresponding in projection position.

* * * * *